United States Patent
Yamada et al.

(10) Patent No.: US 7,914,717 B2
(45) Date of Patent: Mar. 29, 2011

(54) MOLDING DEVICE WITH RELEASING MECHANISM AND METHOD FOR CONTROLLING THE SAME

(75) Inventors: Motohiro Yamada, Kiyose (JP); Hiroshi Miyakoshi, Hachioji (JP)

(73) Assignee: Konica Minolta Holdings, Inc. (JP)

( * ) Notice: Subject to any disclaimer, the term of this patent is extended or adjusted under 35 U.S.C. 154(b) by 0 days.

(21) Appl. No.: 12/595,916

(22) PCT Filed: Apr. 11, 2008

(86) PCT No.: PCT/JP2008/057168
§ 371 (c)(1), (2), (4) Date: Oct. 14, 2009

(87) PCT Pub. No.: WO2008/129962
PCT Pub. Date: Oct. 30, 2008

(65) Prior Publication Data
US 2010/0044898 A1    Feb. 25, 2010

(30) Foreign Application Priority Data
Apr. 19, 2007    (JP) .................................. 2007-110335

(51) Int. Cl.
*B29C 33/44*    (2006.01)
(52) U.S. Cl. .................. 264/40.1; 425/136; 425/139
(58) Field of Classification Search ................ 264/40.1; 425/136, 137, 139; 427/133, 135
See application file for complete search history.

(56) References Cited

U.S. PATENT DOCUMENTS

| 3,952,079 A | * | 4/1976 | Ozelli et al. ................ 264/45.5 |
| 4,308,063 A | * | 12/1981 | Horiuchi et al. ........... 106/38.22 |
| 4,737,091 A | * | 4/1988 | Fiorentini ....................... 425/88 |
| 5,176,923 A | | 1/1993 | Ito |
| 5,246,643 A | * | 9/1993 | Inaba et al. ................. 264/40.1 |
| 6,398,536 B2 | * | 6/2002 | Onishi .......................... 425/136 |
| 6,669,877 B2 | * | 12/2003 | Matsubayashi et al. ..... 264/40.1 |

FOREIGN PATENT DOCUMENTS

| JP | 3-57592 A | 3/1991 |
| JP | 3-124417 A | 5/1991 |
| JP | 4-320823 A | 11/1992 |
| JP | 5-345343 A | 12/1993 |
| JP | 2005-88296 A | 4/2005 |
| JP | 2007-81048 A | 3/2007 |

OTHER PUBLICATIONS

Electronic translation of Japan refernce 2005-88296.*
International Search Report for International Application No. PCT/JP2008/057168 mailed May 20, 2008 with English translation.

* cited by examiner

*Primary Examiner* — Jill L Heitbrink
(74) *Attorney, Agent, or Firm* — Cantor Colburn LLP

(57) ABSTRACT

A molding device for easily releasing a molding material produced by transferring a minute shape to resin using a die having the minute shape formed thereon from the die with no damage. A method for controlling such molding device is also provided. The molding device and the control method are characterized in that the force for releasing the molding material from the die is detected and an alarm signal is delivered if the number of times when the releasing force becomes higher than a level preset depending on the molding material reaches a preset number of times.

12 Claims, 10 Drawing Sheets

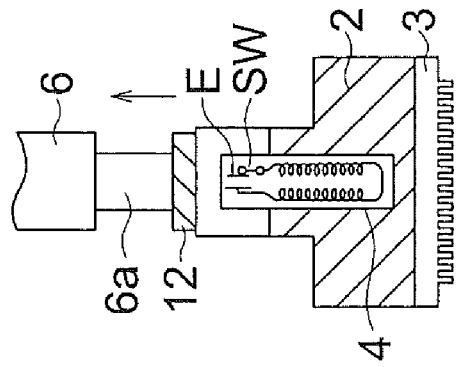
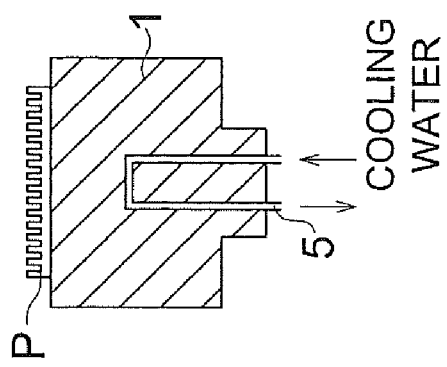
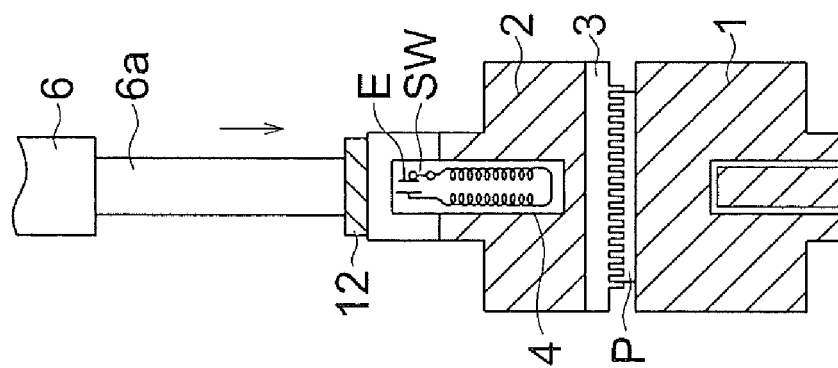
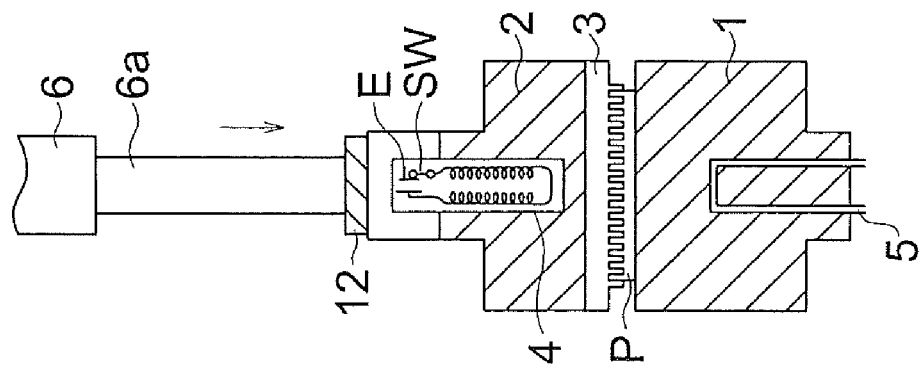
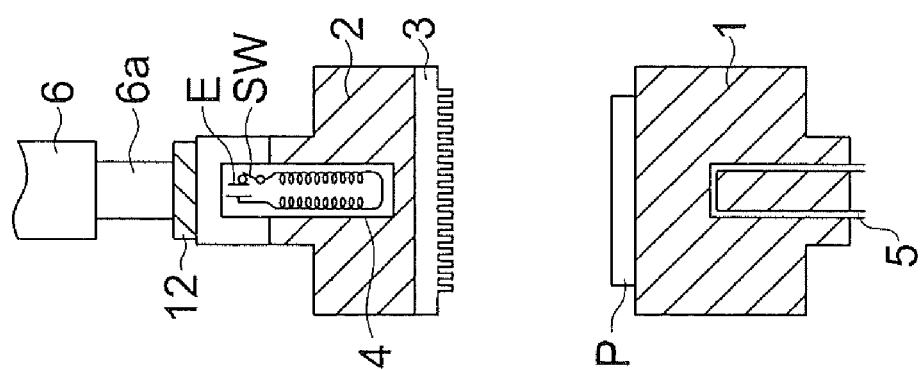
FIG. 14a    FIG. 14b    FIG. 14c    FIG. 14d

MOLDING DEVICE WITH RELEASING MECHANISM AND METHOD FOR CONTROLLING THE SAME

CROSS REFERENCE TO RELATED APPLICATIONS

This is a U.S. national stage of application No. PCT/JP2008/057168, filed on 11 Apr. 2008. Priority under 35 U.S.C. §119(a) and 35 U.S.C. §365(b) is claimed from Japanese Application No. 2007-110335, filed 19 Apr. 2007, the disclosure of which is also incorporated herein by reference.

FIELD OF THE INVENTION

The present invention relates to a molding device for transferring the minute shape of a die onto a molding material to perform molding operations, and a method for controlling the same.

BACKGROUND OF THE INVENTION

In the field of optical parts, information recording medium, and biotechnology-related parts, a minute shape is required to be molded on a member in recent years. To meet this requirement, efforts have been made to develop a technique of producing a molding material having a minute shape formed thereon, wherein pressure is applied to a die having minute shape formed thereon, and the minute shape is transferred onto the resin molding material.

Generally, in the resin molding process using a molding device equipped with the aforementioned die, difficulties will occur in the molding releasing operation if the mold releasing force in the mold releasing step of releasing the molding material from the die is greater than predetermined mold releasing force. This may damage the molding material. Especially in the case of a molding device based on nano-imprinting method (also called the nano-imprinting device) wherein a minute shape is transferred onto the resin and molding operation is performed, using the die (also called a mold or a stamper) with a minute shape formed thereon, the minute shape transferred onto the molding material will be more susceptible to damages if the mold releasing force is greater.

In this case, the aforementioned predetermined mold releasing force differs for each molding material according to the type of the resin, the size and shape of the molding material, molding conditions and other factors.

Thus, to improve the mold release characteristics, the surface of the die is generally coated with a mold release agent. The mold release agent is subjected to deterioration with the multiple times of molding operations, and the release characteristics are reduced. Thus, if there is an increase in the mold releasing force, and the mold releasing force has increased over a predetermined level, the molding material and die will be more susceptible to damage, as described above. Particularly, the portion of minute shape will be vulnerable to damage.

FIG. 12 shows the result of measuring the changes in the mold releasing force resulting from the number of shots for a certain product (product A). In this example, if the mold releasing force has exceeded 0.40N, the minute shape transferred onto the molding material will be damaged. In the following description, the aforementioned predetermined mold releasing force that causes the minute shape to start being damaged will be called critical mold releasing force.

Under the circumferences described above, the management of the mold releasing force and maintenance of the die are very important.

Regarding the maintenance of the die, a die management apparatus has been proposed, wherein the time of die maintenance including the time of die replacement is indicated through management of the number of molding shots (Patent Document 1 for example).

According to another proposal, the die maintenance including the die replacement is managed wherein the period when die maintenance is required based on the number of molding shots is added to the period when maintenance is required based on the time elapsed after the previous maintenance (Patent Document 2 for example).

Patent Document 1: Unexamined Japanese Patent Application Publication No. Hei 3-124417
Patent Document 2: Unexamined Japanese Patent Application Publication No. Hei 5-345343

DISCLOSURE OF INVENTION

Problems to be Solved by the Invention

Patent Document 1 uses the number of molding shots to manage the die maintenance. Patent Document 2 manages die maintenance, using the number of molding shots and the time elapsed after the maintenance.

However, factors causing changes in the mold releasing force include variations in the coating of mold release agent, deterioration of the mold release agent, storage and usage conditions of the die, and deterioration of the die. This cannot justify the argument that the changes in mold releasing force depend on the number of molding shots and the time elapsed after the maintenance, and the changes occur almost uniformly.

Thus, the die management using the number of molding shots and the time elapsed after the maintenance fails to perform the die maintenance with consideration given to the aforementioned factors for changes. This fails to produce the molding material characterized by enhanced yields and stable quality.

In view of the situations described above, it is an object of the present invention to provide a molding device and method for controlling the same wherein a molding material produced by transferring a minute shape onto resin using a die having the minute shape formed thereon can be easily released from the die without the molding material being damaged.

Means for Solving the Problems

The aforementioned object can be achieved by the following structures and methods:

1. A molding device including:
a die having a minute shape formed thereon;
a transfer mechanism for transferring the shape of the aforementioned die onto a molding material by bringing the die into contact with the molding material and applying pressure thereto;
a mold releasing mechanism for releasing the molding material from the die; and
a mold releasing force detecting mechanism for detecting the mold releasing force when the molding material is released from the die;
wherein an alarm signal is outputted if the number of times the mold releasing force becomes equal to or higher than the mold releasing force value preset in conformity to the molding material has reached a preset number of times.

2. The molding device described in the item 1 which has a display device that displays an alarm in response to the aforementioned alarm signal.

3. The molding device described in the item 1 or 2, wherein continuous production of the molding material is suspended in response to the alarm signal.

4. The molding device described in any one of the items 1 through 3, to which a mold release agent coating mechanism is provided to apply a mold release agent onto the surface of the die in response to the alarm signal.

5. The molding device described in any one of the item 1 through 4, to which a die change mechanism is provided to change the die in response to the alarm signal.

6. A method for controlling a molding device including:
a transfer step for transferring the shape of a die having a minute shape onto a molding material by bringing the die into contact with the molding material and applying pressure thereto;
a mold releasing step for releasing the molding material from the die; and
a mold releasing force detecting step for detecting the mold releasing force in the aforementioned mold releasing step; and
an alarm signal output step for outputting an alarm signal if the number of times the mold releasing force becomes equal to or higher than a mold releasing force value preset in conformity to the molding material has reached a preset number of times.

7. The method for controlling a molding device described in the item 6 wherein an alarm display step is provided to display the state of alarm in response to the alarm signal.

8. The method for controlling a molding device described in the item 6 or 7, wherein continuous production of the molding material is suspended in response to the alarm signal.

9. The method for controlling a molding device described in any one of the items 6 through 8, wherein a mold release agent coating step for coating the surface of the die with a mold release agent is provided to apply the mold release agent in response to the alarm signal.

10. The method for controlling a molding device described in any one of the items 6 through 9, wherein a die change step is provided to change the die in response to the alarm signal.

Effects of the Invention

The management of the mold releasing force of a molding device and maintenance of the die depend on the mold releasing force during releasing the molding material from the die, not the number of molding shots, whereby the management of the mold releasing force and maintenance of the die are performed with consideration given to variations in the coating of mold release agent, deterioration of the mold release agent, storage and usage conditions of the die, and deterioration of the die. Management is performed in such a way that the molding material molded by transferring a minute shape onto a resin is easily released. This arrangement provides a molding material characterized by enhanced yields and stable quality, without the molding material or die being damaged.

The management is based on the actual operation conditions. This eliminates the need of allowing for safety factors as in the case of management based on the number of shots, with the result that the management cycle is prolonged and the product cost is reduced.

BRIEF DESCRIPTION OF THE DRAWINGS

Each of FIGS. 1a, 1b, 1c and 1d is a schematic partial diagram representing the molding device of the present invention.

Figure 4A:
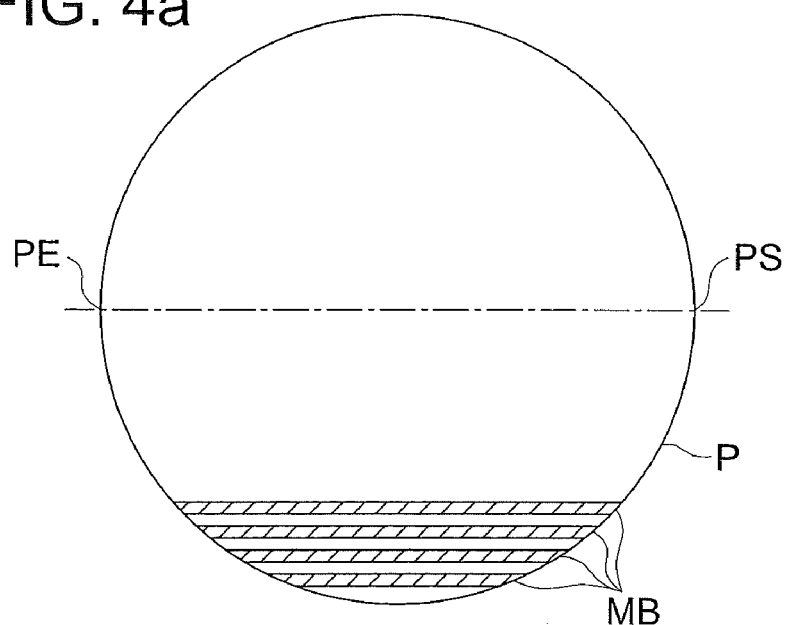
Figure 4B:
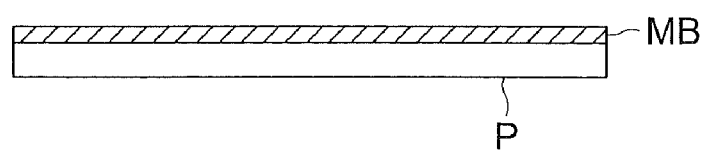

Each of FIGS. 4a and 4b is a diagram representing the molding material to which a minute shape has been transferred.

Figure 5:
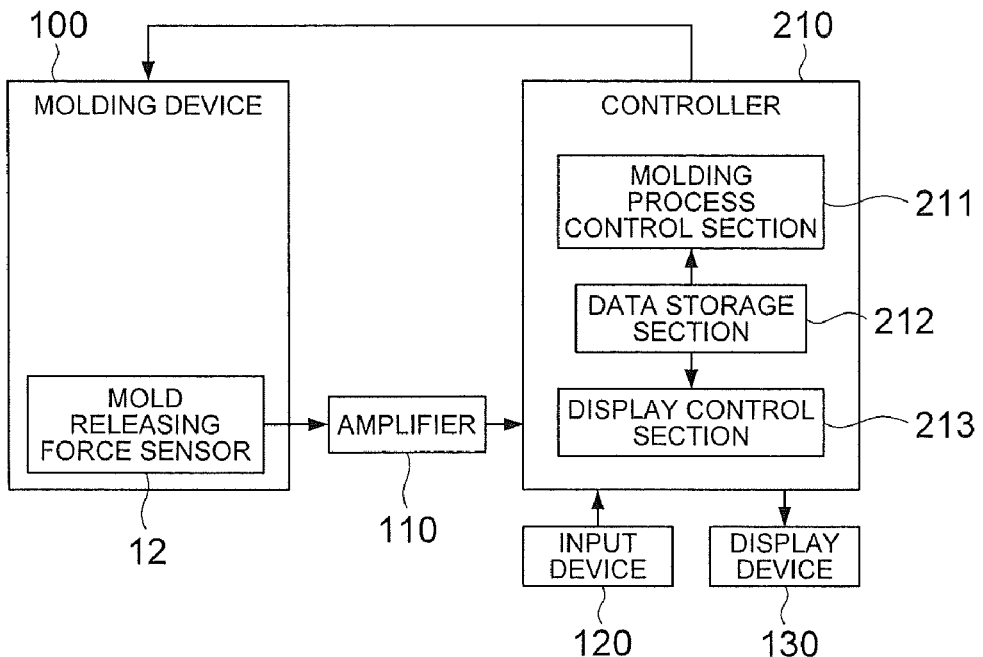

FIG. 5 is a configuration diagram representing the structure of Example 1.

Figure 6:
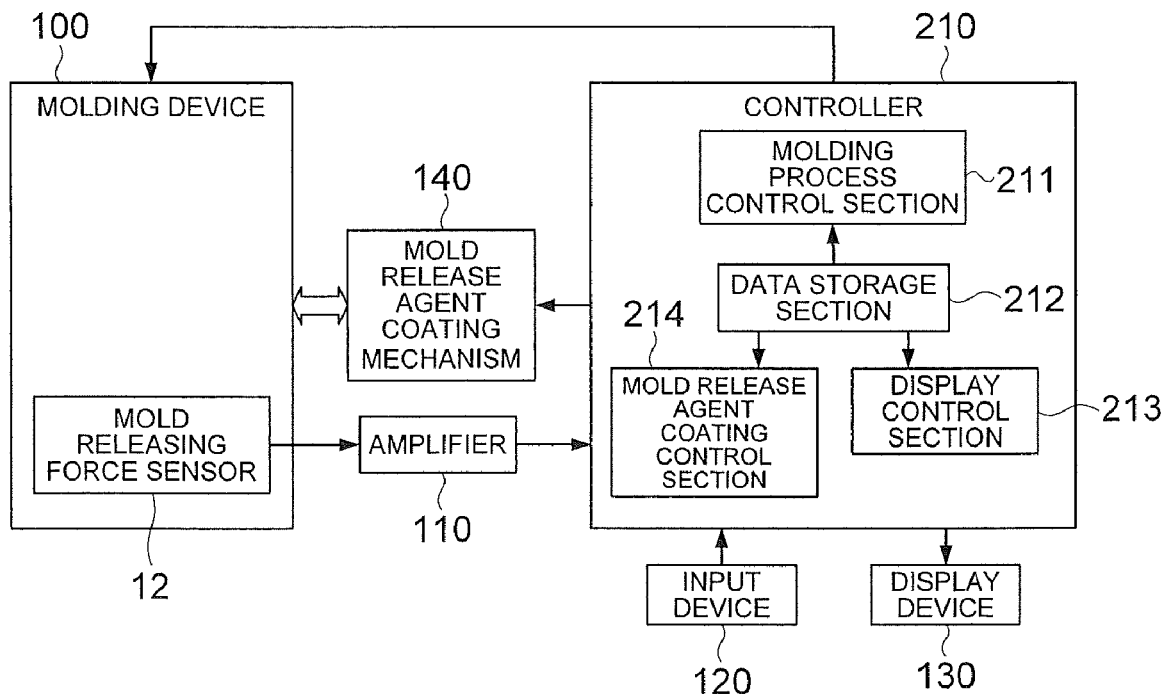

FIG. 6 is a configuration diagram representing the structure of Example 2.

Figure 7:
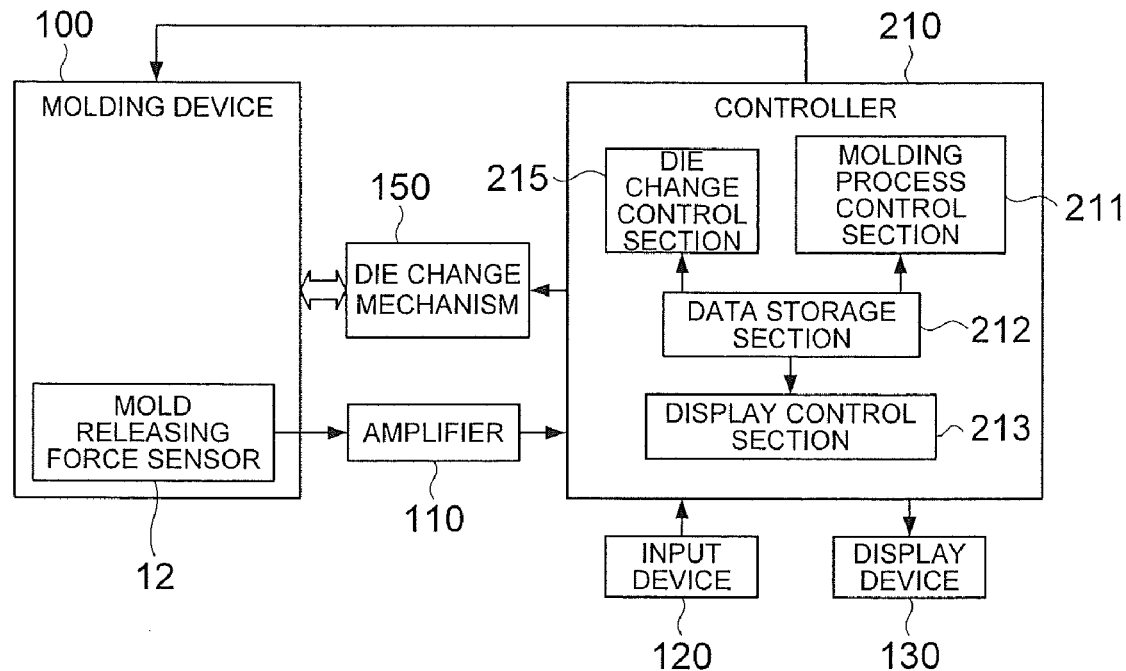

FIG. 7 is a configuration diagram representing the structure of Example 3.

Figure 8:
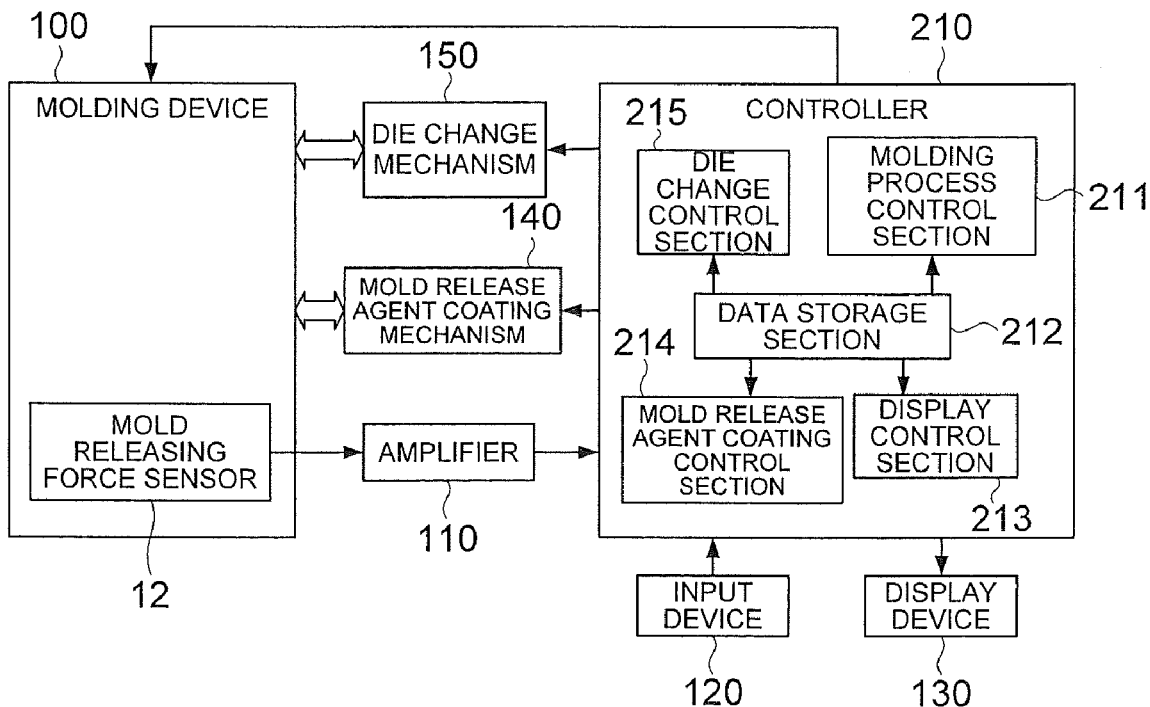

FIG. 8 is a configuration diagram representing the structure of Example 4.

Figure 9:
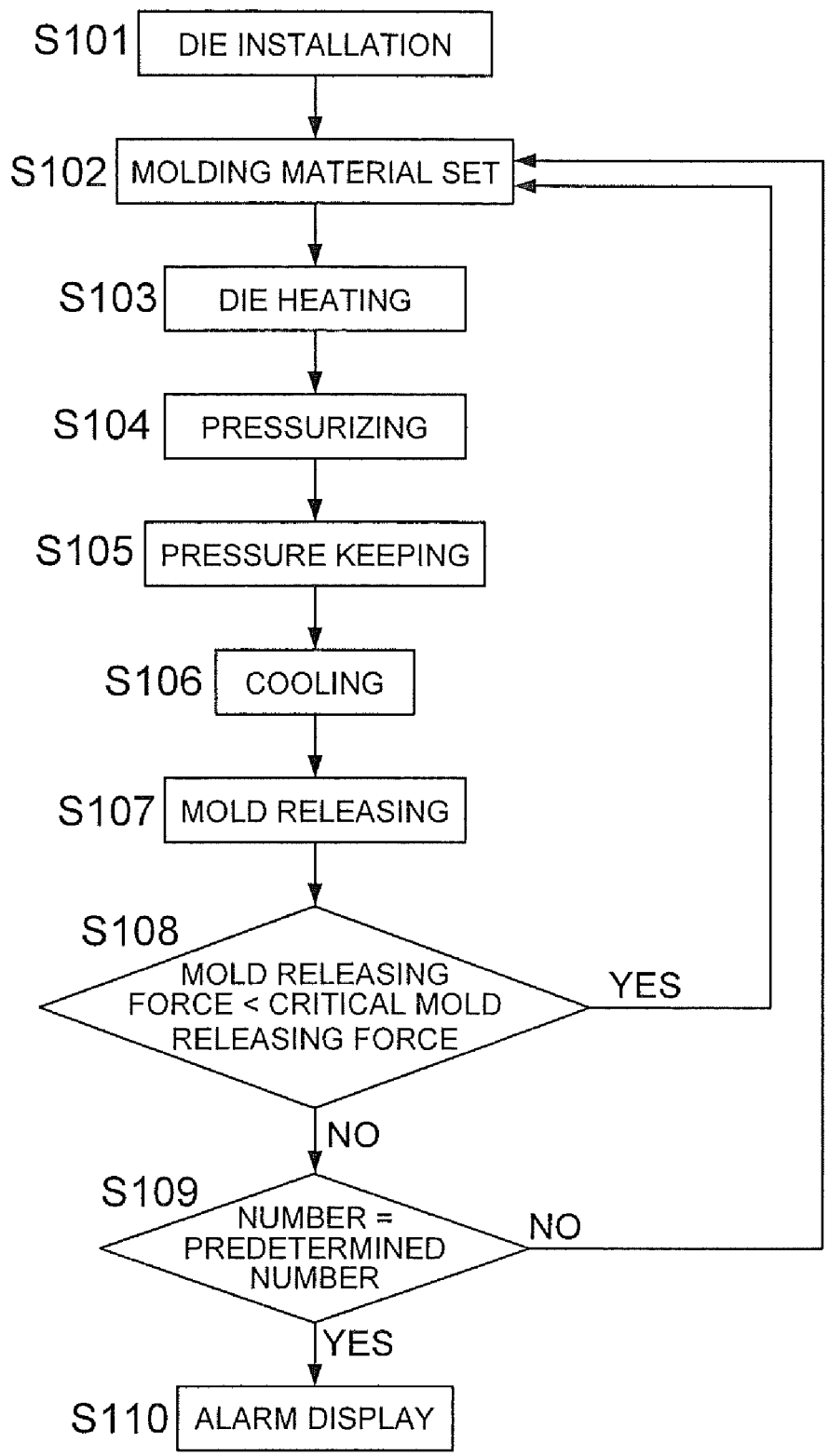

FIG. 9 is a flow chart showing the flow in Example 1.

Figure 10:
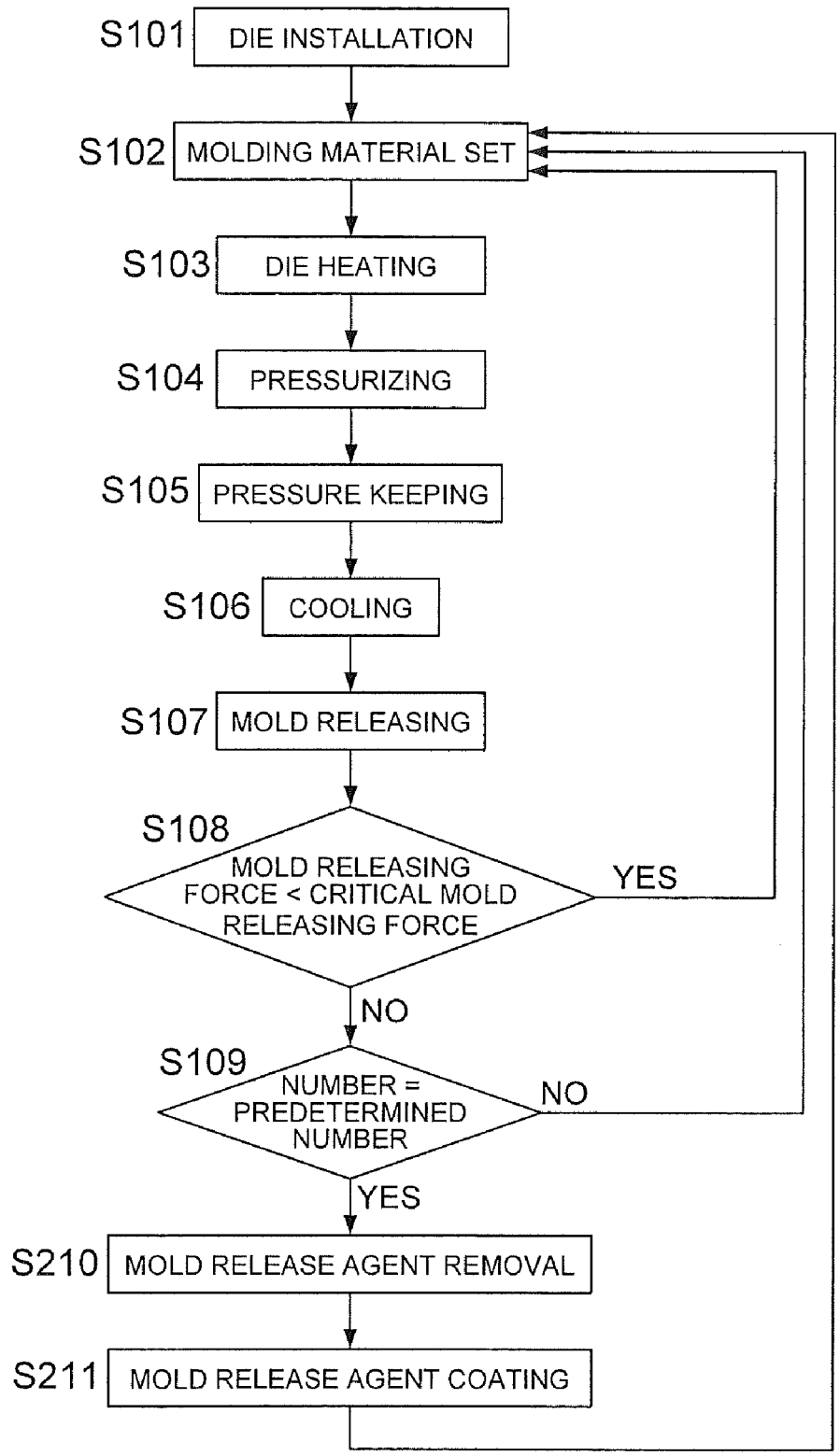

FIG. 10 is a flow chart showing the flow in Example 2.

Figure 11:
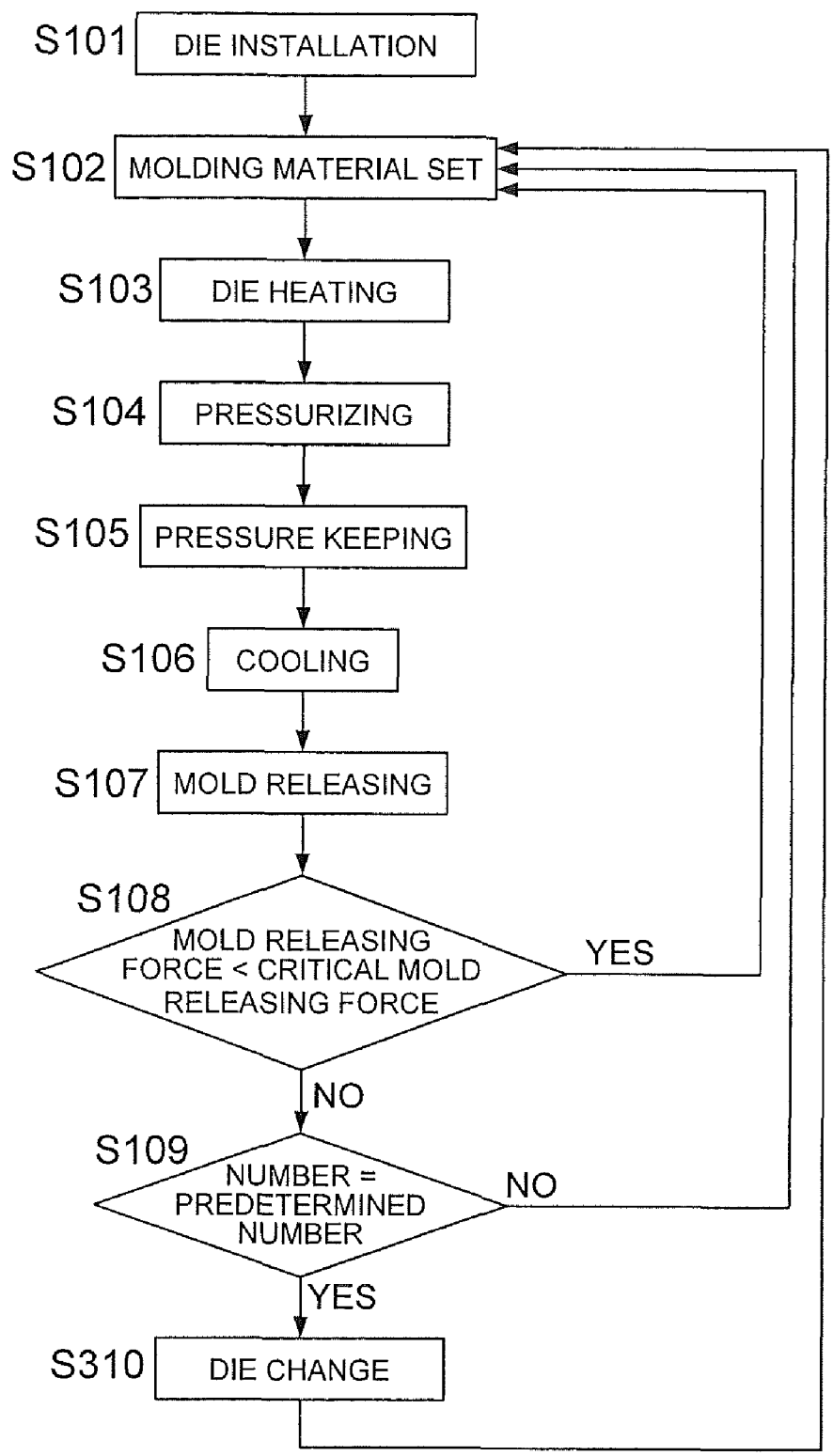

FIG. 11 is a flow chart showing the flow in Example 3.

Figure 12:
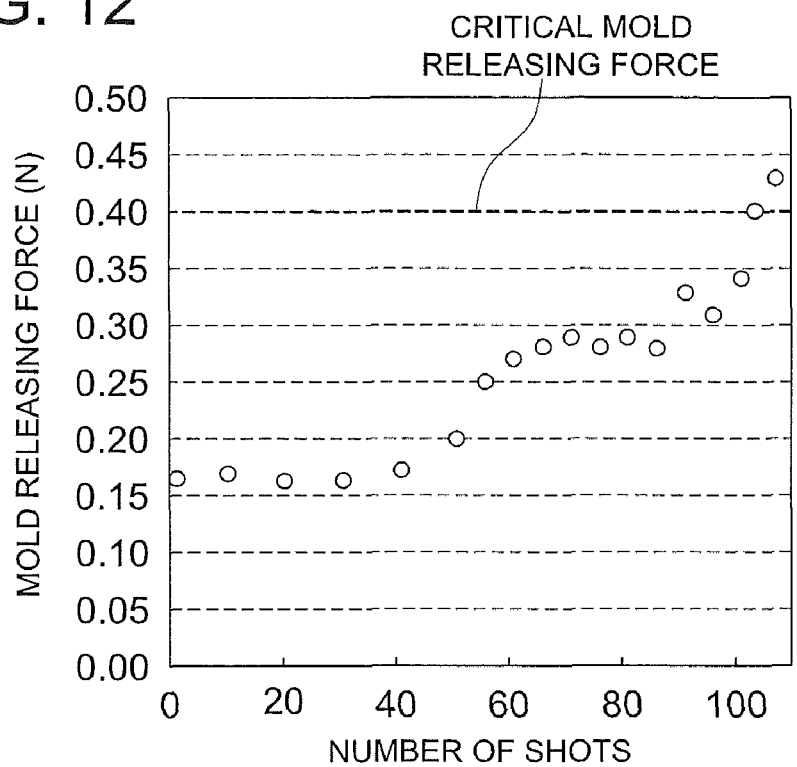

FIG. 12 is a diagram showing an example of changes in the mold releasing force depending on the number of shots of a product.

Figure 13:
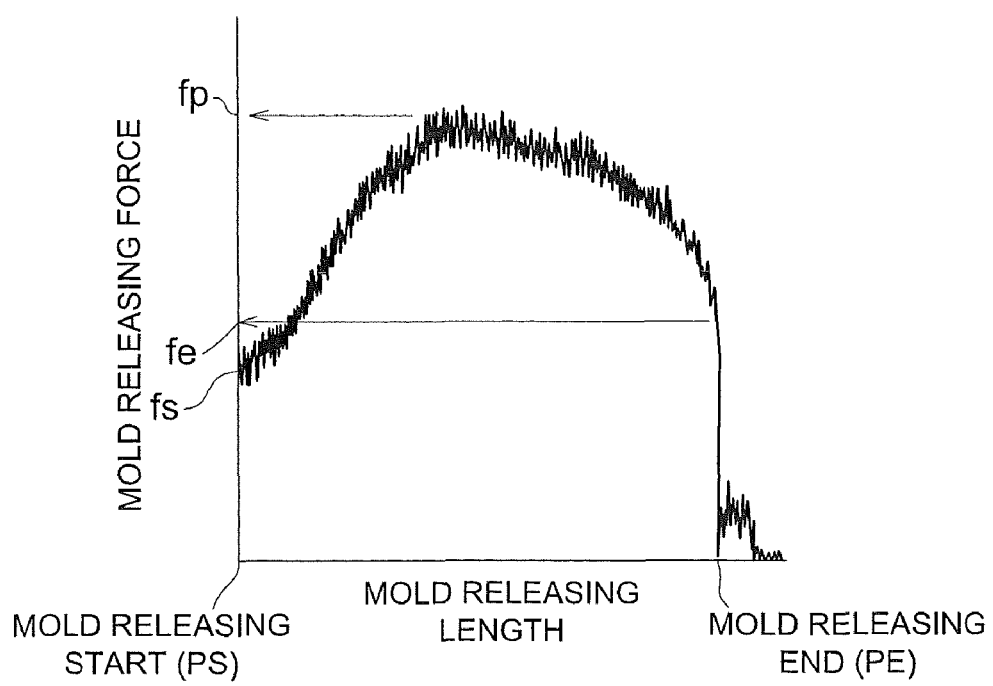

FIG. 13 is a diagram showing the changes in the mold releasing force from the start of releasing the molding material from the die, to the completion of the releasing.

Each of FIGS. 14a, 14b, 14c and 14d is a schematic partial view representing the molding device of another mold releasing type.

DESCRIPTION OF REFERENCE NUMERALS

1. Base
2. Die fixing plate
3. Die
4. Heater
5. Cooling pipe
6. Hydraulic cylinder
6a. Piston rod
11. Clamp
12. Mold releasing force sensor
13. Plunger
100. Molding device
110. Amplifier
120. Input device
130. Display device
140. Mold release agent coating mechanism
150. Die change mechanism
210. Controller
MA. Die protrusion
MB. Molding material protrusion
P. Molding material
SW. Switch

THE BEST MODE TO PERFORM THE INVENTION

The following describes the embodiments of the present invention with reference to drawings, without the present invention being restricted thereby.

Each of FIGS. 1a, 1b, 1c and 1d is a schematic partial diagram representing an example of the molding device 100 to which the present invention is applicable.

In each of FIGS. 1a, 1b, 1c and 1d, a die fixing plate 2 is arranged above a base 1 fixed on the frame (not illustrated) wherein the die fixing plate 2 is capable of relative movement. The base 1 and die fixing plate 2 are made of a metal as exemplified by SUS. A resin-made molding material is placed on the upper portion of the base 1.

A heater 4 connected to a power source E through a switch SW is arranged inside the hollow die fixing plate 2. The upper portion of the die fixing plate 2 is connected with a piston rod 6a of the hydraulic cylinder 6 as a driving member. Pressurized hydraulic oil is supplied to the hydraulic cylinder 6 from a hydraulic source (not illustrated), whereby the piston rod 6a is moved downward in the drawing. When the hydraulic oil goes back to the hydraulic source, the piston rod 6a is moved upward in the drawing. A cooling pipe 5 is arranged inside the base 1. The cooling pipe 5 can be mounted on the die fixing plate 2 instead of the base 1.

Figure 2:
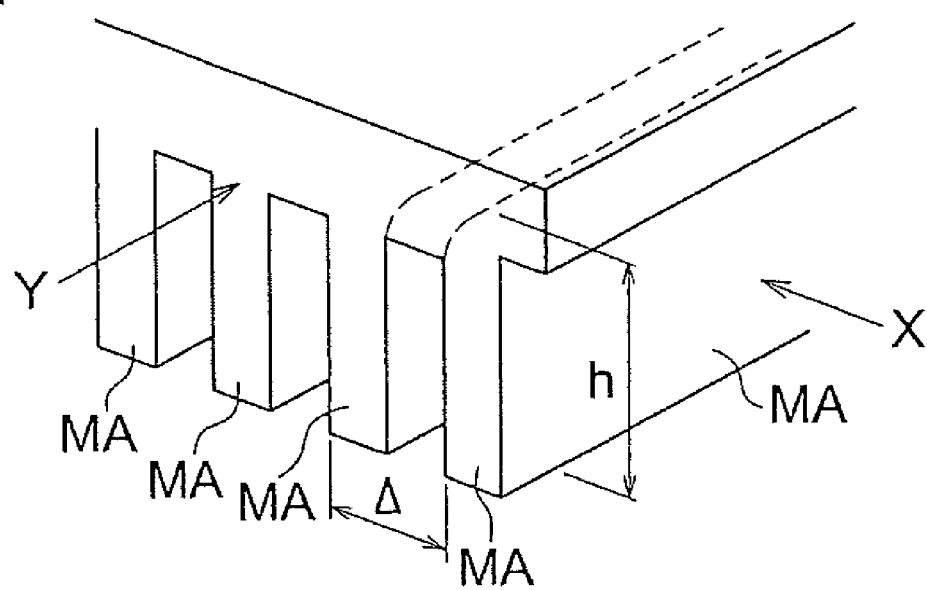
FIG. 2 is a schematic diagram representing an example of a minute shape.

A die 3 is mounted on the lower surface of the die fixing plate 2. A minute shape to be transferred onto the molding material P is formed on the lower surface of the die 3. FIG. 2 is a schematic diagram representing an example of the minute shape. In this example, a plurality of die protrusions MA (also called the walls) as tabular structures are formed at a constant pitch $\Delta$ as the minute shape. The pitch $\Delta$ is in the range from 100 through 400 nm. The die protrusion MA is 1000 through 2500 nm high. However, the present invention is not restricted to this embodiment. Mold release agent is coated on the surface (i.e., the transfer surface) wherein the minute shape of the die 3 is formed.

The following describes the molding step using the molding device 100 shown in FIGS. 1a, 1b, 1c and 1d.

Figure 1:
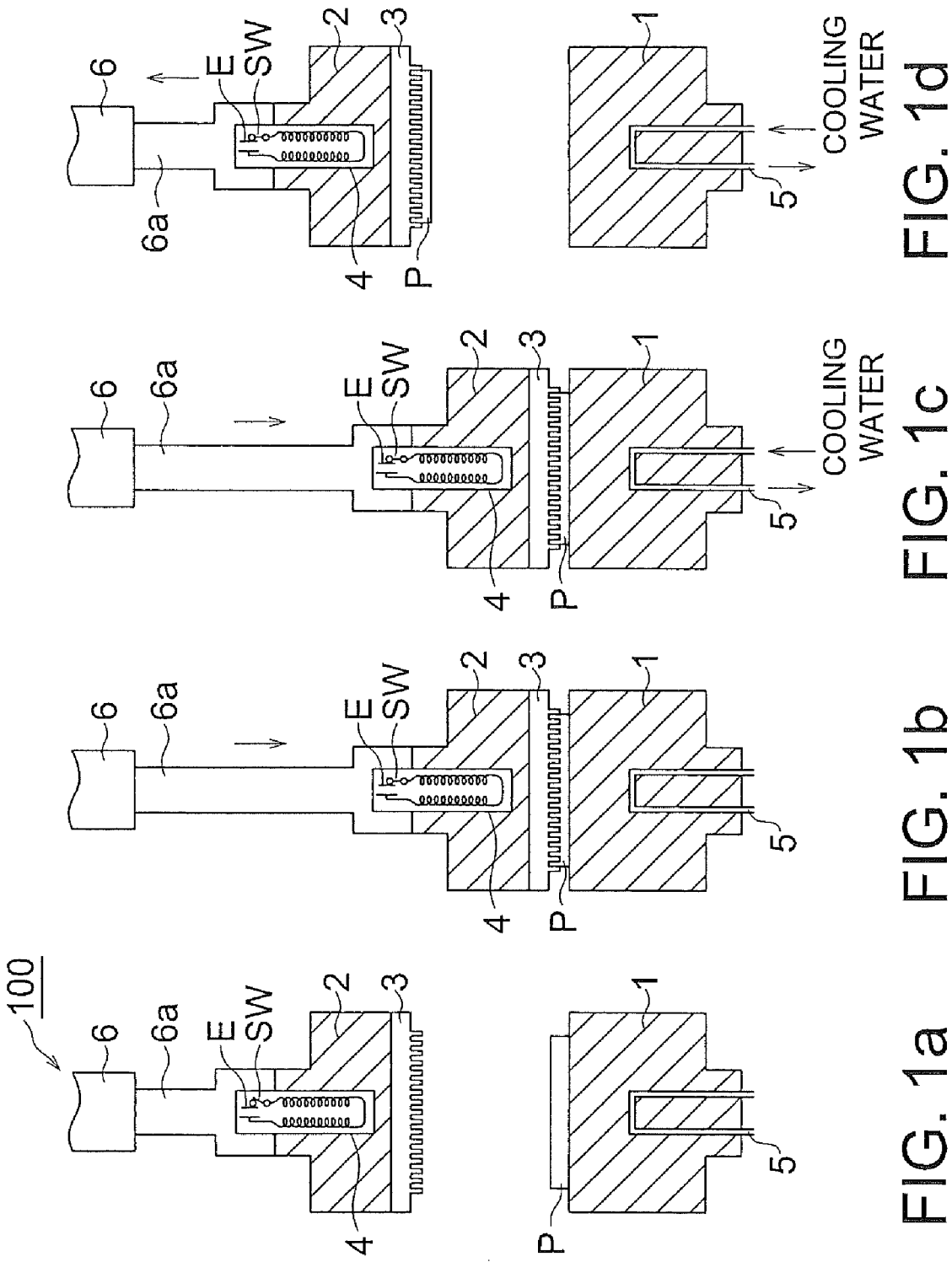

The molding material P is placed on the base 1. When the switch SW is turned on, the heater 4 mounted on the back surface of the die 3 is heated by the power supplied from the power source E, and the temperature of the die 3 is increased (FIG. 1a). In this stage, cooling water is not yet put into the cooling pipe 5 of the base 1.

If the temperature of the die 3 has come close to the set temperature, the hydraulic cylinder 6 is driven and the minute shape of the die 3 is brought into contact with the molding material P. After that, pressing operation is performed (FIG. 1b). This procedure allows the minute shape of the die 3 to be transferred to the molding material P. After the lapse of predetermined time, cooling water is poured, whereby the die 3 is subjected to sudden cooling. The switch SW is turned off at the same time, then the heating operation by the heater 4 is suspended (FIG. 1c).

When the temperature of the die 3 has been further reduced to a predetermined temperature, the hydraulic cylinder 6 is driven in the reverse direction and the die fixing plate 2 is moved upward so as to be separated from the base 1 (FIG. 1d). In this case, the molding material P together with the die 3 in close contact with the same is separated from the base 1 in the present embodiment. The procedure of releasing the molding material P from the die 3, that is a mold release, will be described later.

The cooling water having cooled the die 3 is ejected. The above description refers one cycle of operation wherein the minute shape is transferred to the molding material P from the die 3.

The following describes the detection and management of the mold releasing force in the present invention, and the maintenance of the die 3 based thereon.

Figure 3:
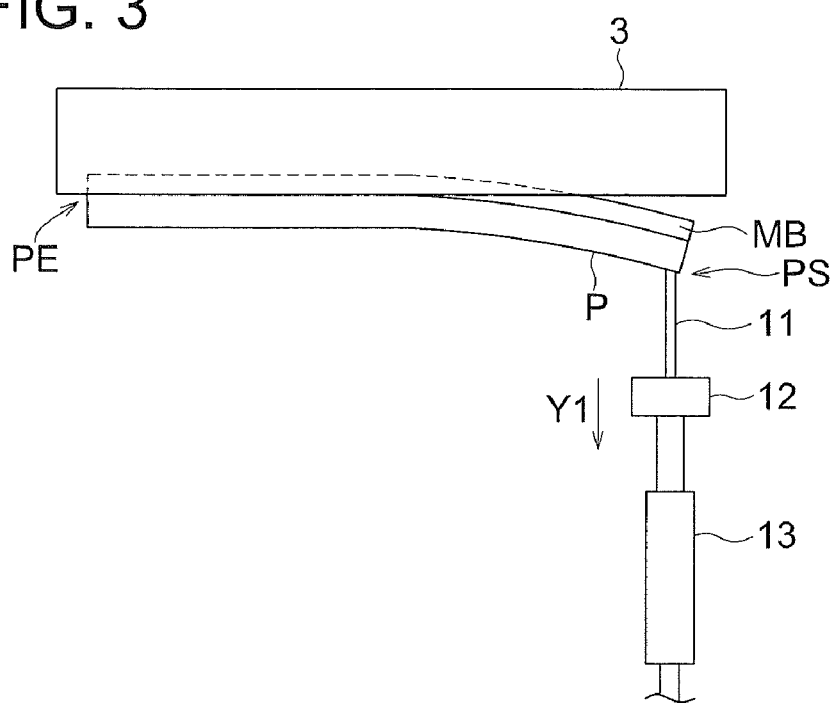
FIG. 3 is a schematic diagram representing the mold releasing mechanism of the present invention.

The molding material P with the minute shape of the die 3 transferred thereon, as shown in FIG. 1d, is released from the die 3. FIG. 3 is a schematic diagram representing the mold releasing mechanism of the present invention. The aforementioned mold releasing mechanism includes a clamp 11, mold releasing force sensor 12 and plunger 13. Each of FIGS. 4a and 4b is a diagram representing the molding material P to which a minute shape has been transferred. FIG. 4a is a top view, while FIG. 4b is a side view. As shown in FIGS. 4a and 4b, the molding material P is formed into a disk in the present embodiment. In FIGS. 4a and 4b, the molding material protrusion MA is partly illustrated.

As shown in FIG. 3, the clamp 11 holds one side PS shown in FIGS. 3 and 4a, of the molding material P having the minute shape transferred thereto and kept in close contact with the die 3. The end PS of the molding material P is pulled by the plunger 13 in the arrow direction Y1, and is separated toward the other end PE shown in FIGS. 3 and 4a so that the molding material P is released from the die 3. A mold releasing force sensor 12 is provided as a mold releasing force detecting mechanism between the clamp 11 and plunger 13, and the mold releasing force is detected by this mold releasing force sensor 12. A load cell or the like can be used as the mold releasing force sensor 12.

The following describes the procedure of maintaining the die 3 using the step of detecting the mold releasing force:

EXAMPLE 1

FIG. 5 is a configuration diagram representing the structure of Example 1. A controller 210 controls the molding device 100. A molding process control section 211 controls each section in the molding process. A data storage section 212 stores various forms of data used in the molding device 100, for example, the data on the type of die, the number of shots, and past molding record. The display control section 213 controls the display device 130. At the time of molding operation, the input device 120 is operated to input various forms of data used to give instructions to the molding device, for example, the data on the type of die and the number of shots. The various forms of inputted data are stored in the data storage section 212.

The input device 120 is operated to input the value for a predetermined mold releasing force preset in conformity to the molding material, i.e., the critical mold releasing force. This data is stored in the data storage section 212.

The mold releasing force detected by the mold releasing force sensor 12 is amplified by an amplifier 110, and is fed to the controller 210. The data on mold releasing force fed to the controller 210 is compared with the critical mold releasing force stored in the data storage section 212. If the mold releasing force is below the value of the critical mold releasing force, the molding operation continues. When the number of times the mold releasing force is equal to or has exceeded the critical mold releasing force has reached a predetermined number, an alarm signal is outputted. An instruction is given from the display control section 213 in response to the alarm signal, and the alarm is displayed on the display device 130. The predetermined number of times mentioned above is inputted through the input device 120 in advance and is stored in the data storage section 212.

Based on the alarm display, the operator suspends the production and performs maintenance of the die 3. The maintenance is carried out by coating the die 3 with mold release agent, or by replacing the die.

Preferably, the aforementioned production is automatically suspended simultaneously with alarm display. This allows the production of nonconforming products to be suspended.

The aforementioned number of times is normally one. This can be updated by the operator entering a new instruction through the input device 120. This value can be updated by the instruction of the operator, for example, when the planned number of shots remains very small, or when the continued operation will bring about cost advantages.

When the molding material P is to be separated from the die 3 in the direction from one end PS to the other end PE, as shown in FIG. 3, the mold releasing force changes according to the mold releasing distance from the start of mold releasing to the end of the mold releasing. FIG. 13 shows the changes in the mold releasing force from the start of releasing the molding material P from the die, to the completion of the releasing. In this example, a peak value fp is used as the mold releasing force for decision. However, the minute shape tends to be damaged in the vicinity of the terminal point of the mold releasing operation, i.e., in the vicinity of the other end PE. Thus, the mold releasing force "fe" immediately before the completion of mold releasing operation can be considered as a mold releasing force for decision. The critical mold releasing force set in this case is different from the critical mold releasing force when "fp" is assumed as the mold releasing force.

FIG. 9 is a flow chart showing the flow in Example 1. In Step 101, the die 3 is mounted in position (S101). In Step 102, the molding material P is set (S102). In Step 103, the die 3 is heated (S103). In Step 104, the molding material P is pressurized by the die 3 (S104). In Step 105, the molding material P is kept under pressure for a predetermined period of time by the die 3 (S105). In Step 106, cooling water is supplied to the cooling pipe 5 and die 3 is cooled. At the same time, the molding material P is also cooled (S106). In Step 107, the die 3 and molding material P are separated from the base 1 and the molding material P is released from the die 3. The mold releasing force is detected (S107) in the step of the mold being released as described above. The mold releasing force is compared with the critical mold releasing force in Step 108. If the mold releasing force is smaller than the critical mold releasing force (YES in S108), the step goes to S102, wherein the molding operation continues. If the mold releasing force is equal to or greater than the critical mold releasing force (NO in S108), the step goes to S109. In Step 109, the number of times is determined. If the number of times is smaller than predetermined number of times (NO in S109), the step goes to S102, wherein the molding operation continues. If the number of times is equal to the predetermined number of times (YES in S109), the step goes to S110. In Step 110, an alarm signal is outputted, and the alarm is displayed. At the same time, production is suspended.

When the number of times is determined in the aforementioned Step 109, production suspension does not occur practically if the predetermined number of times is one.

EXAMPLE 2

FIG. 6 is a configuration diagram representing the structure of Example 2. Example 2 is different from Example 1 in that a mold release agent coating mechanism 140 and mold release agent coating control section 214 are provided. The Example 2 is the same as the Example 1 in the molding step, mold releasing force detection and comparison step, and alarm signal output and display step.

In Example 2, as shown in the flow chart of FIG. 10, if the number of times is equal to the predetermined number of times in the Step 109 for determining the number of times (YES in S109), the step goes to S210. In Step 210, the mold release agent remaining in the die 3 is removed (S210). This is followed by Step 211 wherein the die 3 is coated with a new mold release agent (S211). After that, the molding operation continues.

In Example 2, the maintenance of the die 3 by the step of coating with the mold release agent is carried out automatically. This improves the availability factor of the molding device 100.

EXAMPLE 3

FIG. 7 is a configuration diagram representing the structure of Example 3. The Example 3 differs from the Example 1 in that a die change mechanism 150 and die change control section 215 are provided. The Example 3 is the same as the Example 1 in the molding step, mold releasing force detection and comparison step, and alarm signal output and display step.

In Example 3, as shown in the flow chart of FIG. 11, if the number of times is equal to predetermined number of times in the Step 109 of determining the number of times (YES in Step 109), the step goes to S310. In Step 310, the die is replaced by another one (S310). After that, the molding operation continues.

In Example 3, the maintenance of die 3 by die replacement is performed automatically. This improves the availability factor of the molding device 100.

EXAMPLE 4

FIG. 8 is a configuration diagram representing the structure of Example 4. The Example 4 is the combination of Examples 2 and 3, and differs from the Example 1 in that a mold release agent coating mechanism 140, mold release agent coating control section 214, die change mechanism 150 and die change control section 215 are provided. The Example 4 is the same as the Example 1 in the molding step, mold releasing force detection and comparison step, and alarm signal output and display step.

In Example 4, mold release agent is coated as in Example 2, and the molding operation continues. After this has been performed two times or more, the die is replaced, and the molding operation continues further. This procedure further improves the availability factor of the molding device 100 over that in Examples 2 and 3. Since the number of shots by one die can be increased (i.e., the molding time can be prolonged), it is possible to prolong the time for repairing the other die having been removed from the molding device. This can lead to a decrease in the number of the dies of the same type. The flow chart is omitted.

In the aforementioned examples, as shown in FIG. 1d and FIG. 3, the molding material P is released from the die 3 as follows. In the first place, the molding material P together with the die 3 in close contact with the same is separated from the base 1. This is followed by the step of releasing the molding material from the die 3. It is also possible to use the Release Form 1, which will be described below.

Other Mold Release Form 1

In the other mold release form 1 shown in FIGS. 14a, 14b, 14c and 14d, the molding material P is placed on the base 1 and is fixed on the base 1. The molding material P is fixed, for example, by a double-faced tape or by a vacuum suction method. A mold releasing force sensor 12 such as a load cell is placed between the die fixing plate 2 and piston rod 6a. Other structure and molding method conform to those of the aforementioned examples:

As shown in FIG. 14d, upon completion of transfer, the hydraulic cylinder G is driven in the reverse direction and the die fixing plate 2 is raised and the release from the base 1 is achieved. During this time, the molding material P is kept held on the base 1. Thus, when the die fixing plate 2 is separated from the base 1, the molding material P is released from the die 3. In the aforementioned releasing operation, all the surfaces of the molding material P are released uniformly and simultaneously. At the time of releasing, the mold releasing force is detected by the mold releasing force sensor 12. The peak value for the detected mold releasing force serves as the mold releasing force which is used to determine the mold releasing force. After the state shown in FIG. 14d, the molding material P is removed from the base 1.

Control subsequent to detection of the mold releasing force and maintenance of the die 3 are performed in conformity to the Examples 1 through 4.

As described above, the management of the mold releasing force of the molding device and maintenance of the die are performed, using the mold releasing force at the time of releasing the molding material from the die. This arrangement ensures that the management of the mold releasing force and maintenance of the die can be performed with due consideration given to dispersion and deterioration in the coating of mold release agent, storage and usage conditions of the die, and die deterioration. Thus, management can be performed in such a way that the molding material is easily released. This arrangement provides a molding material characterized by enhanced yields and stable quality, without the molding material or die being damaged.

The management is based on the actual operation conditions. This eliminates the need of allowing for safety factors as in the case of management based on the number of shots, with the result that the management cycle is prolonged and the product cost is reduced.

What is claimed is:

1. A method for controlling a molding device comprising:
   transferring a shape of a die having a minute shape onto a molding material by bringing the die into contact with the molding material and applying pressure thereto;
   releasing the molding material from the die sequentially from one edge to another edge of a transfer part on the molding material, the transfer part being a part onto which the shape of the die has been transferred;
   detecting a mold releasing force in the mold releasing step; and
   outputting an alarm signal if a number of times the mold releasing force becomes equal to or higher than a mold releasing force value preset in conformity to the molding material has reached a preset number of times.

2. The method for controlling a molding device of claim 1, further comprising:
   displaying an alarm in response to the alarm signal, and wherein, in the outputting step, the alarm signal is outputted if a number of times the mold releasing force at a specific position in the transfer part becomes equal to or higher than the mold releasing force value preset in conformity to the molding material has reached the preset number of times.

3. The method for controlling a molding device of claim 1, further comprising:
   suspending continuous production of the molding material in response to the alarm signal.

4. The method for controlling a molding device of claim 1, further comprising:
   coating a surface of the die with a mold release agent for application of the mold release agent in response to the alarm signal.

5. The method for controlling a molding device of claim 1, further comprising:
   changing the die in response to the alarm signal.

6. The method for controlling a molding device of claim 1, wherein, in the detecting step, the mold releasing force in the mold releasing step is detected sequentially from one edge to another edge of the transfer part.

7. A molding device for use with a molding material, the molding device comprising:
   a die having a minute shape formed thereon;
   a transfer mechanism for transferring a shape of the die onto the molding material by bringing the die into contact with the molding material and applying pressure thereto;
   a mold releasing mechanism for releasing the molding material from the die sequentially from one edge to another edge of a transfer part on the molding material, the transfer part being a part onto which the shape of the die has been transferred; and
   a mold releasing force detecting mechanism for detecting a mold releasing force when the molding material is released from the die,
   wherein a molding device is configured to output an alarm signal if a number of times the mold releasing force becomes equal to or higher than a mold releasing force value preset in conformity to the molding material has reached a preset number of times, and
   wherein the molding device is configured to output the alarm signal if a number of times the mold releasing force at a specific position in the transfer part becomes equal to or higher than the mold releasing force value preset in conformity to the molding material has reached the preset number of times.

8. The molding device of claim 7, further comprising:
   a display device which displays an alarm in response to the alarm signal.

9. The molding device of claim 7, which suspends continuous production of the molding material in response to the alarm signal.

10. The molding device of claim 7, further comprising:
    a mold release agent coating mechanism to apply a mold release agent onto a surface of the die in response to the alarm signal.

11. The molding device of claim 7, further comprising:
    a die change mechanism to change the die in response to the alarm signal.

12. The molding device of claim 7,
    wherein the mold releasing force detecting mechanism detects the mold releasing force sequentially from one edge to another edge of the transfer part when the molding material is released from the die.

* * * * *